US006501663B1

(12) United States Patent
Pan

(10) Patent No.: US 6,501,663 B1
(45) Date of Patent: Dec. 31, 2002

(54) THREE-DIMENSIONAL INTERCONNECT SYSTEM

(75) Inventor: Alfred I-Tsung Pan, Sunnyvale, CA (US)

(73) Assignee: Hewlett Packard Company, Palo Alto, CA (US)

(*) Notice: Subject to any disclaimer, the term of this patent is extended or adjusted under 35 U.S.C. 154(b) by 0 days.

(21) Appl. No.: 09/514,484

(22) Filed: Feb. 28, 2000

(51) Int. Cl.[7] .......................... H01L 23/52; H01L 23/538
(52) U.S. Cl. ....................... 361/779; 361/760; 361/783; 361/803; 174/260; 257/723; 257/777; 257/779; 257/783; 228/180.22
(58) Field of Search ................................ 361/743, 760, 361/765, 767, 768, 771, 782–784, 779, 803, 820; 174/52.1, 52.4, 260; 228/180.21, 180.22, 256–262; 257/737, 738, 779, 777, 783, 723; 29/830, 832, 840

(56) References Cited

U.S. PATENT DOCUMENTS

| 4,635,093 A | * | 1/1987 | Ross ........................... 174/260 |
| 4,992,847 A | * | 2/1991 | Tuckerman .................. 257/623 |
| 5,186,381 A | * | 2/1993 | Kim ....................... 228/180.22 |
| 5,193,738 A | | 3/1993 | Hayes ...................... 228/180.2 |
| 5,329,423 A | * | 7/1994 | Scholz ........................ 257/738 |
| 5,377,902 A | | 1/1995 | Hayes ........................ 228/254 |
| 5,468,655 A | * | 11/1995 | Greer ....................... 228/180.22 |
| 5,577,944 A | * | 11/1996 | Taylor .................... 228/180.22 |
| 5,598,196 A | | 1/1997 | Braun .......................... 347/68 |
| 5,615,827 A | * | 4/1997 | Arldt et al. ............. 228/180.21 |
| 5,641,113 A | * | 6/1997 | Somaki et al. ......... 228/180.22 |
| 5,681,757 A | | 10/1997 | Hayes ........................... 437/7 |
| 5,736,074 A | * | 4/1998 | Hayes et al. .................... 264/6 |
| 5,746,844 A | * | 5/1998 | Sterrett et al. ............... 427/464 |
| 5,772,106 A | | 6/1998 | Ayers et al. ................. 228/254 |
| 5,778,964 A | | 7/1998 | Kawaguchi et al. ......... 164/271 |
| 5,779,971 A | | 7/1998 | Pan et al. .................... 266/237 |
| 5,861,323 A | | 1/1999 | Hayes ......................... 438/111 |
| 5,868,305 A | | 2/1999 | Watts, Jr. et al. ............ 228/254 |
| 5,876,615 A | | 3/1999 | Predetechensky ........... 222/590 |
| 5,894,985 A | | 4/1999 | Orme-Marmarelis et al. .... 228/262 |
| 5,938,102 A | | 8/1999 | Muntz et al. ................ 228/102 |
| 6,137,062 A | * | 10/2000 | Zimmerman ................ 174/260 |
| 6,236,111 B1 | * | 5/2001 | Legay et al. ................. 257/528 |
| 6,404,061 B1 | * | 6/2002 | Hikita et al. ................. 257/688 |

OTHER PUBLICATIONS

Multilayer Ceramic MCM–The Emerging Platform for High–Speed Digital and Radio Frequency Circuit Integration; MicroNews, 1st Quarter 2000, vol. 6, No. 1, pp. 25–30.*

Electronic Modules With a 3–D Interconnection Scheme; Tech Briefs, Feb. 2000, vol. 24, No. 2, pp. 44–45.*

(List continued on next page.)

Primary Examiner—Albert W. Paladini
Assistant Examiner—John B. Vigushin
(74) Attorney, Agent, or Firm—Trueman H. Denny, III

(57) ABSTRACT

A three-dimensional interconnect system is disclosed. The interconnect system electrically connects electrical devices that are disposed on different physical planes. The interconnect system includes a plurality of contiguously interconnected electrically conductive droplets such as solder ball droplets produced by a print-on-demand solder jet system. An interconnect is formed by repeatedly ejecting the conductive droplets along a predetermined path between components to be connected. Each ejected droplet is disposed adjacent to another ejected droplet to form a contiguously linked chain of droplets that bridge a physical gap between the components. A non-conductive coating can be deposited on the interconnect to protect the interconnect from damage and to encase the interconnect. The electrical resistance of the interconnect can be reduced by reflowing the droplets that form the interconnect, whereby the coating that encses the interconnect is operative to maintain the shape of the interconnect after reflow.

11 Claims, 11 Drawing Sheets

OTHER PUBLICATIONS

MicroFab Technote 99–01, Background on Ink–Jet Technology–Continuous Mode Ink–Jet Tecnology, MicroFab Technologies,Inc., Sep. 28, 1999 (www.microfab.com/papers/mfabri97/indexp24.htm).

David B. Wallace & Donald J. Hayes, "Solder Jet Printing of Micropads and Vertical Inteconnects", MicroFab Technologies, Inc. (www.microFAB.com/papers/smta97).

Donald J. Hayes, David B. Wallace & W. Royall Cox, "MicroJet Printing of Solder and Polymers for Multi–Chip Modules and Chip–Scale Packages", MicroFab Technologies, Inc., IMAPS '99 (www.microFAB.com/papers/smta97/smta97.htm).

U.S. patent application Ser. No. 09/136,551, Pan, filed Aug. 19, 1998.

David B. Wallace & Donald J. Hayes, "Solder Jet Technology Update",—Proceedings ISHM 97, MicroFab Technologies, Inc.

Donald J. Hayes, W. Royall Cox and Michael E. Grove, "Low–Cost Assembly and Inteconnect Using Ink–Jet Printing Technology", MicroFab Technologies, Inc., Display Works '99.

John Wargo, John Gauci, et al., "MLC Advanced Groundrule Design Implementation", MicroNews (a publication of IBM Microelectronics), First Quarter 2000—vol. 6, No. 1, p. 12–16.

\* cited by examiner

700

THREE-DIMENSIONAL INTERCONNECT SYSTEM

FIELD OF THE INVENTION

The present invention relates generally to a three-dimensional interconnect system for electrically interconnecting a plurality of electronic devices that are disposed on different physical planes. More specifically, the present invention relates to a three-dimensional interconnect system that includes a plurality of contiguously interconnected electrically conductive droplets that form an interconnect. The interconnect electrically connects electronic devices that are disposed on different physical planes.

Articles and publications set forth herein are presented for the information contained therein: none of the information is admitted to be statutory "prior art" and we reserve the right to establish prior inventorship with respect to any such information.

BACKGROUND ART

Modern electronic systems typically include a printed circuit board (PC board) or some other substrate upon which are mounted one or more integrated circuits (IC's). Generally, the IC's are electrically connected to the PC board by solder, for example. The solder is operative to electrically communicate the. IC's with conductive traces on the PC board and to physically attach the IC's to the PC board. In some applications the IC's may also be attached to the PC board by an adhesive. As the physical geometries of semiconductor elements contained in an IC continue to shrink, it is possible to integrate several electronic functions onto a single IC. Resulting is an increase in the number of input and output connections (IO's) that are required to communicate electrical signals to and from the IC.

One approach to increasing the number of available connections between an IC die and electronics external to the die is to connect the die to a PC board using solder balls. Typically, the IC die includes an array of bonding pads disposed on a surface of the IC die. The bonding pads are spaced apart by a predetermined pitch that matches the pitch of corresponding contact pads on the PC board or substrate. For example, the above mentioned approach is used in a flip-chip on PC board process to mount one or more IC die to a PC board. The solder bumps are operative to electrically connect the IC with conductive traces. Typically, a network of conductive traces and conductive vias disposed on the PC board are operative to electrically connect the IC to the other components.

FIG. 1 is an illustration of a prior art flip-chip assembly 1. The assembly 1 includes a substrate 3 and a semiconductor die 5. The substrate 3 includes contact pads 7 disposed on a surface of the substrate 3. For instance, the substrate 3 can be a PC board or a ceramic material used for multi-chip modules. The semiconductor die 5 includes bonding pads 9 disposed on a surface of the die 5. The die 5 and the substrate 3 are physically and electrically connected by solder balls 11 that are operative to electrically communicate the bonding pads 9 with the contact pads 7.

FIG. 2 is an illustration of another type of prior art flip-chip assembly 21. The assembly 21 includes a substrate 23 and a semiconductor die 25. The substrate 23 includes contact pads pads 27 disposed on a surface of the substrate 23. The semiconductor die 25 includes bonding pads 29 disposed on a surface of the die 25. The semiconductor die 25 includes columns 33 disposed on the bonding pads 29. The columns 33 are formed by depositing a conductive material on the bonding pads 29 to form the columns 33. A dielectric 35 is deposited on the semiconductor die 5 and surrounds the columns 33 thereby electrically insulating the columns 3 from one another. A portion of the dielectric 35 is removed so that the solder balls 31 can be deposited on the columns 33. The die 25 and the substrate 23 are physically and electrically connected by the solder balls 31 that are operative to electrically connect the bonding pads 29 with the contact pads 27.

FIG. 3 is an illustration of a prior art chip-scale assembly 41. The assembly 41 includes a substrate 43 and a semiconductor die 45. The substrate 43 includes contact pads pads 47 disposed on a surface of the substrate 43 and the semiconductor die 45 includes bonding pads 49 disposed on a surface of the die 45. The die 45 and the substrate 43 are physically and electrically connected by solder balls 51 that are operative to electrically communicate the bonding pads 49 with the contact pads 47. The bonding pads 49 are electrically connected to the solder balls 51 by vertical segments 63 and 67, and horizontal segments 75 and 77. In a manner similar to that shown in FIG. 2, dielectric layers 53, 55, and 57 are deposited on the die 5 to insulate the segments from one another. The solder balls, the vertical segments, and the horizontal segments of FIGS. 1 through 3 can be deposited using solder deposition techniques such as a demand mode solder jet droplet system. Other prior art methods for depositing solder balls include: physically placing prefabricated solder balls on the bonding pads; vapor phase deposition on a shadow mask to deposit solder on the bonding pads followed by reflowing the solder to form solder balls; and screen printing solder paste onto the bonding pads.

Due to the small size of an IC die and the large number of IO's required for complex IC's, the bonding pads and their corresponding contact pads as discussed above in reference to prior art FIGS. 1 through 3 can have a width in the range of about 50 $\mu$m to about 100 $\mu$m, and the pitch between pads can be in the range of about 100 $\mu$m to about 250 $\mu$m. As the number of IO's continues to increase the pad width and the pitch will decrease to accommodate additional bonding pads.

There are several disadvantages to the Prior art assemblies of FIGS. 1 through 3. First, the solder bumping process used can include sputtering, vapor deposition, photolithography, photoresist, reflowing, and etching steps. Those steps are complicated, time consuming, and expensive. Moreover, those steps are susceptible to micro contamination and other yield reducing defects.

Second, to reduce the surface tension of the solder so that the solder will bond to the contact pad, a wetting metal such as nickel (Ni) is deposited on the contact pad using vacuum sputtering. After the sputtering step, another sputtering step is used to deposit a thin film of an anti-oxidation metal such as gold (Au) on the nickel to protect the nickel from being oxidized. Depending on the size of the PC board, the amount of gold required can be very expensive.

Third, the cost, complexity, and number of steps required in PC board manufacturing result in economies of scale that can only be realized over large production runs. Consequently, small production runs, custom production runs, and one-of-a-kind production runs are economically unpractical with current PC board manufacturing processes. For example, due to the small $\mu$m spacings between bonding pads, the process for depositing the dielectric layers shown in FIGS. 2 and 3 requires precise manufacturing steps that are neither amendable to nor economically feasible for small production runs.

Fourth, CAD tools are used to lay out the pattern of conductive traces and vias on the PC board. Once the layout pattern is frozen and production of the PC board has begun, any design changes or errors in the layout can be costly and time consuming to implement. For example, in FIG. 3, a change in the layout positions of the contact pads 49 would require a new layout for the layers 53, 55, and 57, as well as a new layout for the vertical segments 63 and 67, and the horizontal segments 75 and 77.

Finally, the assemblies of FIGS. 1 through 3 do not allow for a direct connection between components disposed on a different physical planes. Instead, the substrate/PC board serves as an intermediate conductor between components to be connected. For example, when the components are mounted on opposing sides of a PC board, the conductive traces and vias of the PC board are operative to electrically communicate a component mounted on one side of the PC board with a component mounted on the opposite side of the PC board. On the other hand, even if components are mounted on the same side of the PC board a connection between the components is accomplished by the traces and vias. Since the PC board is fabricated prior to mounting the components, defects in the traces or vias can result in short circuits or open circuits that are difficult if not impossible to repair or rework.

Therefore, there is a need for an interconnect system that connects electronic devices that are disposed on different physical planes without using a PC board or the like, reduces the cost and complexity associated with PC board manufacturing, makes a direct connection between components, and can be used for to both large and small production runs.

SUMMARY OF THE INVENTION

The present invention provides a three-dimensional interconnect system that is operative to electrically connect electrical devices that are disposed on different physical planes. The present invention further provides a method for making a three-dimensional interconnect system in which conductive droplets are deposited to form an electrical connection between electrical devices that are disposed on different physical planes. Additionally, the present invention provides a system for making a three-dimensional interconnect system that includes a droplet ejector for ejecting the conductive droplets.

According to the system and method disclosed herein, at least two electronic devices can be electrically connected by an interconnect. The interconnect of the present invention can reduce the expense, complexity, time, and the number of steps required in conventional PC board, flip-chip, and multichip module (MCM) manufacturing processes. Additionally, interconnect of the present invention provides the advantage of reduced signal propagation delays by making a short and direct connection between electrical devices. Moreover, the method disclosed herein can be used for both small and large scale production runs. Furthermore, the method of the present invention provides the advantage of quick and low cost post-layout design changes. For example, a CAD program used for designing the layout pattern can be edited to change the layout.

In one embodiment of the present invention, a three-dimensional interconnect system includes a first electrical device disposed on a first physical plane and a second electrical device disposed on a second physical plane. An interconnect is disposed on a portion of the first and second electrical devices and the interconnect electrically connects the first electrical device with the second electrical device. The interconnect includes a plurality of contiguously interconnected electrically conductive droplets. Each droplet is in physical and electrical contact with an adjacent droplet so that the droplets form a single interconnect that can be disposed in three-dimensions. In essence, the droplets form a linked chain (a connecting line without any gap) that bridges a physical gap between the first and second electrical devices.

In a method according to the present invention, the three-dimensional interconnect system is formed by repeatedly ejecting successively contiguous electrically conductive drops along a path between first and second electrical devices to form an interconnect that bridges a physical gap between the first and second electrical devices, the interconnect is operative to electrically connect the first and second devices.

In a system according to the present invention, an ejector is used to eject electrically conductive droplets. The droplets impact a workpiece to form a contiguous interconnect. The interconnect is operative to electrically connect electrical devices that are disposed on the workpiece.

The above and additional advantages of the present invention will become apparent to those skilled in the art from a reading of the following detailed description, taken in conjunction with the accompanying drawings, illustrating by way of example the principles of the present invention.

DETAILED DESCRIPTION

Figure 1:
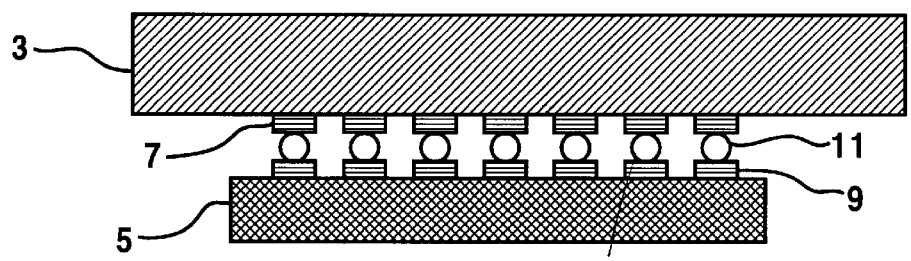
FIG. 1 is a cross-sectional view of a prior art flip-chip assembly that includes solder balls to connect a die to a substrate.
Figure 2:
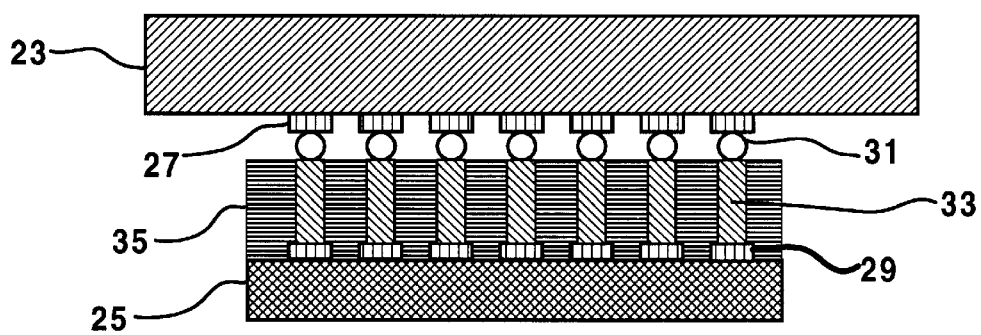
FIG. 2 is a cross-sectional view of a prior art flip-chip assembly that includes solder balls and conductive columns to connect a die to a substrate.
Figure 3:
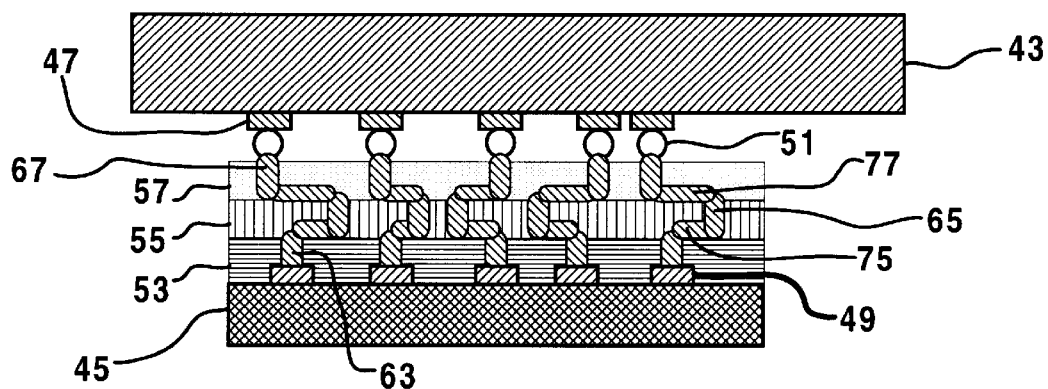
FIG. 3 is a cross-sectional view of a prior art flip-chip assembly that includes solder balls, multiple interconnects, and dielectric layers to connect a die to a substrate.

In the following detailed description and in the several figures of the drawings, like elements are identified with like reference numerals.

As shown in the drawings for purpose of illustration, the present invention is embodied in a three-dimensional interconnect system. The three-dimensional interconnect system includes a first electrical device that is disposed on a first physical plane and a second electrical device that is disposed on a second physical plane. An electrically conductive interconnect is disposed on a portion of the first and second electrical devices. The interconnect is operative to electrically connect the first and second electrical devices.

The interconnect of the present invention includes a plurality of contiguously interconnected electrically conductive droplets. Each droplet is in physical and electrical contact with an adjacent droplet so that the droplets form a single interconnect that can be disposed in three-dimensions. Essentially, the droplets form a linked chain (a connecting line without any gap) that bridges a physical gap between the first and second electrical devices. The interconnect can include segments that are horizontal, vertical, or a combination of horizontal and vertical. For instance, using a Cartesian coordinate system having an X-axis, a Y-axis, and a Z-axis, the interconnect can have segments with a vector along any of those axis or along any combination of those axis. It will be obvious to one skilled in the art that other coordinate systems can be used to describe the spatial orientation of the three-dimensional interconnect system of the present invention.

Additionally, the three-dimensional interconnect system of the present invention can be used to electrically connect first and second contact pads disposed on first and second sides respectively of an electrical device. The electrical device includes a via formed by sidewall surfaces that extend between the first and second sides. The interconnect is disposed on the first and second sides and on a portion of the sidewall surfaces and the interconnect is operative to electrically connect the first and second contact pads.

Figure 4:
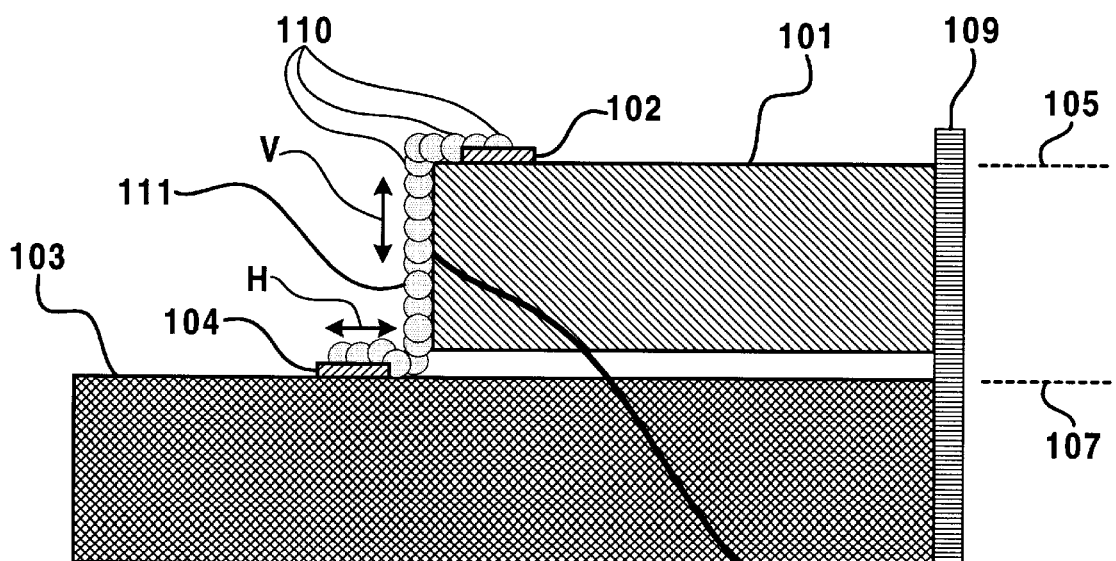
FIG. 4 is a cross-sectional view of a three-dimensional interconnect system according to the present invention.

In one embodiment of the present invention, as illustrated in FIG. 4, a three-dimensional interconnect system 100 includes a first electrical device 101 disposed on a first physical plane 105 (dashed line) and a second electrical device 103 disposed on a second physical plane 107 (dashed line). Although FIG. 4 illustrates the first electrical device 101 disposed above the second electrical device 103 such that the first physical plane 105 is above the second physical plane 107, the orientation of the electrical devices and the orientation of their respective physical planes are not limited to the arrangement illustrated in FIG. 4.

In FIG. 4, the body of the first electrical device 101 is not directly fastened to the body of the second electrical device 103; however, the first electrical device 101 and the second electrical device 103 can be physically connected as will be discussed below in reference to FIG. 5. In FIG. 4, the first electrical device 101 and the second electrical device 103 are attached to a support structure 109. A plurality of contiguously interconnected electrically conductive droplets 110 define an interconnect 111. Each droplet is in physical and electrical contact with an adjacent droplet so that together the droplets 110 form the interconnect 111. Essentially, the droplets 110 form a linked chain (a connecting line without any gap) that bridges a physical gap between the first electrical device 101 and the second electrical device 103.

The interconnect 111 is disposed on a portion of the first electrical device 101 and the second electrical device 103 and the interconnect 111 is operative to electrically connect the first electrical device 101 with the second electrical device 103. The interconnect 111 can include segments that are substantially horizontal as shown by arrow H and/or substantially vertical as shown by arrow V. The vertical segment V is disposed on a vertical portion 108 of the first electrical device 101. However, the interconnect 111 can have a plurality of horizontal H and vertical V segments and can also include segments that have both a horizontal and vertical component. Because the droplets 110 can be disposed in the horizontal segments H and/or the vertical segments V, the interconnect 111 can be disposed in three-dimensions such that it forms a three-dimensional interconnect.

The droplets 110 can be made from an electrically conductive material such as a liquid metal, a conductive polymer, or solder balls. The droplets 110 can be deposited on the first and second electrical devices using a droplet ejector. For example, a solder jet printhead that ejects molten drops of solder can be used to deposit the droplets 110. In principal, a solder jet printhead operates in a manner similar to a thermal ink jet print head used in ink jet printers. By way of example, a general discussion of solder jet printheads can be found in the following Issued U.S. Pat. Nos. 5,779,971; and 5,876,615.

In FIG. 4, the first electrical device 101 includes a first contact pad 102 disposed thereon and the second electrical device 103 includes a second contact pad 104 disposed thereon. The interconnect 111 is disposed on a portion of the first contact pad 102 and on a portion of the second contact pad 104. The interconnect 111 is operative to electrically connect the first contact pad 102 with the second contact pad 104. The term "contact pad" as used herein broadly refers to any electrically conductive node of an electrical device and includes but is not limited to a pin, a bonding pad, a lead, a terminal, a wire, a post, a port, or the like.

Figure 5:
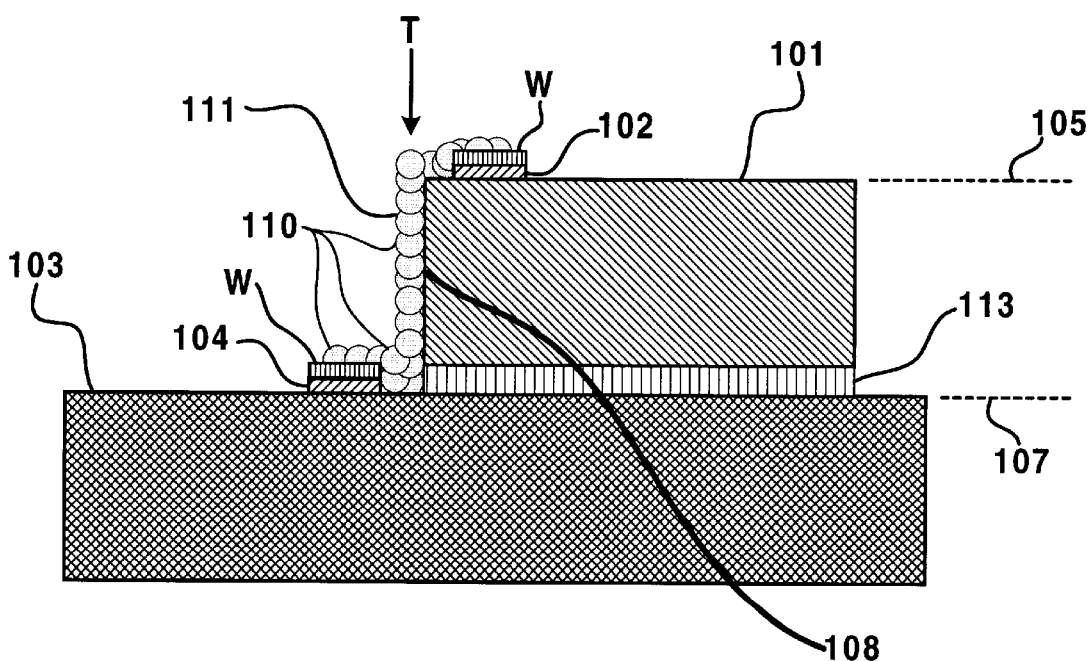
FIG. 5 is a cross-sectional view of the three-dimensional interconnect system in which the electrical devices are fixedly attached to one another according to the present invention.

In another embodiment of the present invention, as illustrated in FIG. 5, the first electrical device 101 and the second electrical device 103 are fixedly attached 113 to one another. The electronic devices can be attached 113 to one another using any suitable method known to those skilled in the art. For example, the electrical devices can be attached by glue, adhesives, fasteners, staking, or welds. In a preferred embodiment, glue or an adhesive is used to physically fastens the first electrical device 101 to the second electrical device 103.

Additionally, in FIG. 5, the contact pads 102 and 104 include a wetting layer W disposed thereon. The wetting layer W is operative to ensure good adhesion and electrical contact between the droplets 110 and the contact pads 102 and 104. For example, the wetting layer W can be a layer of nickel (Ni) and a layer of gold (Au) deposited on the contact pads 102 and 104 using a process such a vacuum sputtering. Typically, the Au is deposited on top of the Ni to prevent oxidation of the Ni. If solder is used for the droplets 110, it may be desirable to use the wetting layer W because the wetting layer W is operative to promote adhesion of an ejected droplet that has impacted on the contact pad so that upon impact the droplet will freeze on the contact pad and adhere thereto.

Figure 6:
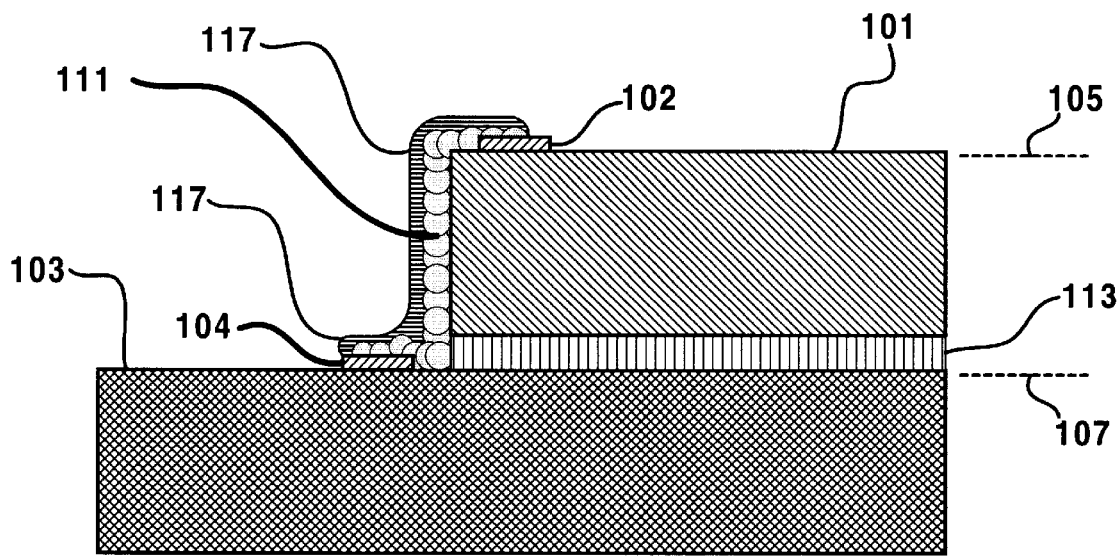
FIG. 6 is a cross-sectional view of the three-dimensional interconnect system that includes a conformal coating that encapsulates the interconnect according to the present invention.

In one embodiment of the present invention, as illustrated in FIG. 6, the three-dimensional interconnect system 100 includes a conformal coating 117 disposed on the interconnect 111. The conformal coating 117 encapsulates the interconnect 111 and is operative to protect the interconnect 111 from damage. The conformal coating 117 can be a polymer, an adhesive, or an inorganic coating.

Figure 7:
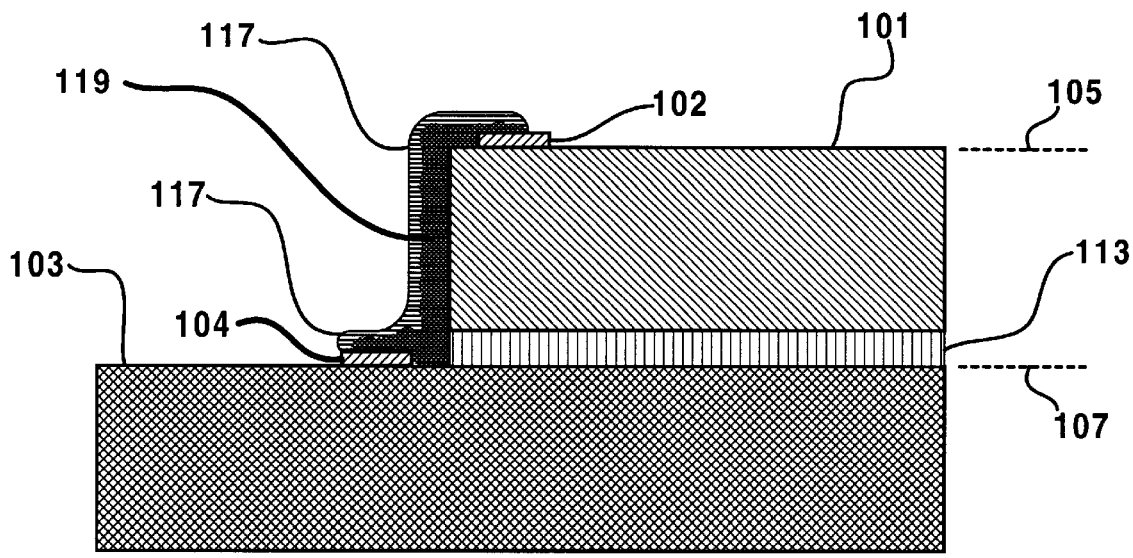
FIG. 7 is a cross-sectional view of a three-dimensional interconnect system having an interconnect that has been reflowed according to the present invention.

In FIG. 7, the encapsulated interconnect 111 of FIG. 6 has been heated to reflow the interconnect 111. Resulting is a reflowed interconnect 119 as illustrated in FIG. 7. For example, if solder ball droplets are used for the droplets 110, the interconnect 111 can be reflowed at a temperature of 200° C. in an inert atmosphere such as $N^2$ (nitrogen) for approximately 10 minutes to form the reflowed interconnect 119. The conformal coating 117 encases the interconnect 119 such that the shape of the interconnect 119 is retained after reflowing. Advantages to reflowing the interconnect 111 include lowering the resistance of the interconnect and improving electrical contact between the droplets 110 and the contact pads. If a polymer is used for the conformal coating 117, a high temperature polymer is preferred if the interconnect 111 is to be reflowed.

Figure 8:
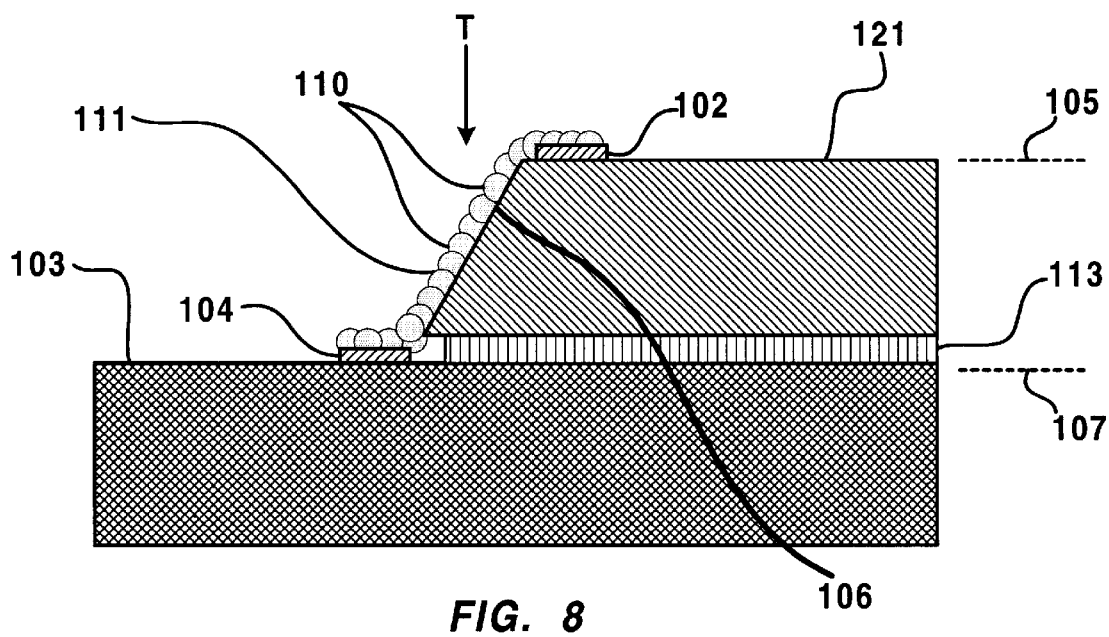
FIG. 8 is a cross-sectional view of a three-dimensional interconnect system that includes an (electrical device having a beveled portion according to the present invention.

In FIG. 8, the three-dimensional interconnect system 100 includes at least one electrical device having a beveled edge (a sloped surface). An electrical device 121 has a beveled edge 106. The interconnect 111 is disposed on at least a portion of the beveled edge 106. On advantage to using the beveled edge 106 is that droplets 110 having an ejection trajectory T (normal to the physical planes 105 and 107) will impact the electrical device 121 on the beveled edge 106 and adhere to the beveled edge 106. On the other hand, as illustrated in FIG. 5, a substantially vertical edge 108 presents a more difficult target for droplets 110 having the ejection trajectory T to impact on and to adhere the vertical edge 108 because the ejection trajectory T is substantially parallel to the vertical edge 108. In FIG. 8, the beveled edge 106 can be formed by a process such as ejection molding, grinding, or milling, for example. For instance, if the electrical device 121 is a semiconductor substrate such as silicon, then an etching process can be used to form the beveled edge 106.

Figure 9:
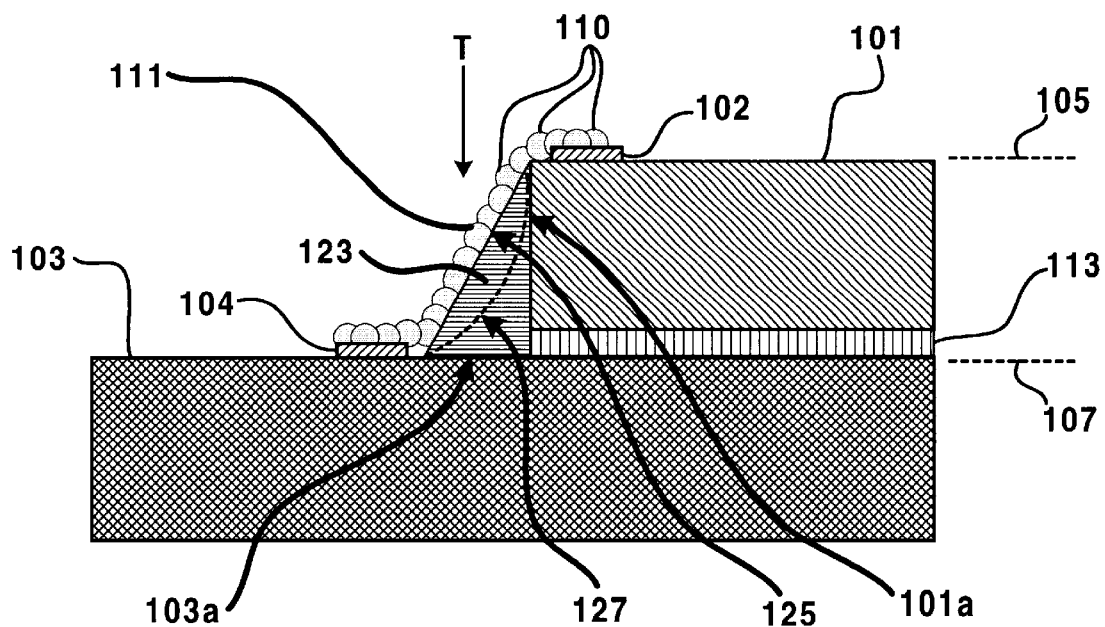
FIG. 9 is a cross-sectional view of a three-dimensional interconnect system that includes an interface coating according to the present invention.

In another embodiment of the present invention as illustrated in FIG. 9, the three-dimensional interconnect system 100 includes an interface coating 123 that is disposed intermediate between adjacent surfaces of the first and second electrical devices 101 and 103. At least a portion of the interconnect 111 is disposed on the interface coating 123. One advantage of the interface coating 123 is that it eliminates the need to bevel the edges of the electrical devices as was discussed above in reference to FIG. 8. The interface coating 123 can be a non-conductive coating if it is desired to prevent electrical shorting between electrical devices. For example, the interface coating can be used to prevent electrical shorting between a sidewall surface 101a of the first electrical device 101 and a base surface 103a of the second electrical device 103. The interface coating can be a material such as a polymer or an inorganic material. Additionally, the interface coating 123 can have a sloped surface 125 that mimics the beveled edge 106 of FIG. 8 or the interface coating 123 can have an arcuate surface 127 (dashed line). Although FIG. 9 shows the arcuate surface 127 having a concave surface shape, the arcuate surface 127 can have a convex surface shape (not shown).

Moreover, the interface coating 123 is operative to ensure that droplets 110 having the ejection trajectory T will impact the interface coating 123 on the sloped surface 125 or the arcuate surface 127 and adhere to the interface coating 123 Furthermore, another advantage to using the interface coating 123 is that the material for the interface coating 123 can be selected to improve adhesion between the droplets 110 and the surface (sloped or arcuate) of the interface coating 123. For example, the material for the interface coating 123 can be selected to enhance adhesion of ejected solder ball droplets to the surface of the interface coating 123. On the other hand, if a conductive polymer is used for the droplets 110, then a suitable material for the interface coating 123 can be selected to ensure adhesion of the conductive polymer droplets to the surface of the interface coating 123.

Figure 10:
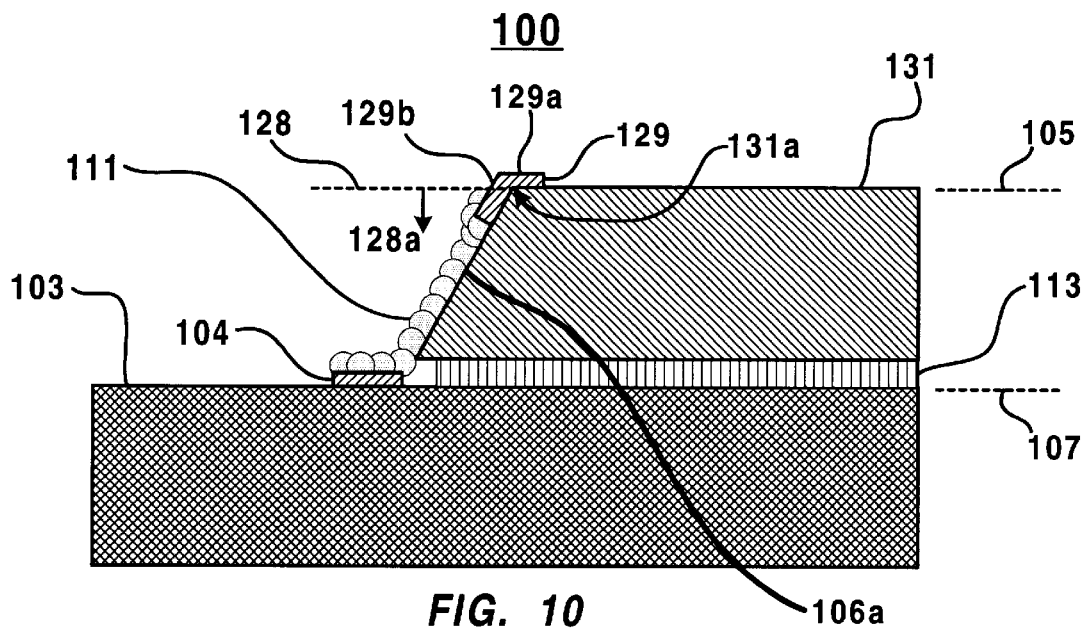
FIG. 10 is a cross-sectional view of a three-dimensional interconnect system that includes a contact pad that is disposed on an edge portion of an electrical device according to the present invention.

In FIG. 10, the three-dimensional interconnect system 100 includes a conformal contact 129 that is disposed on a first electrical device 131. The conformal contact 129 straddles an edge 131a of the first electrical device 131. The interconnect 111 is disposed on at least a portion of the first and second electrical devices 131 and 103 and extends along a portion of a sloped surface 106a of the first electrical device 131. However, the interconnect 111 need not extend all the way to a top portion 129a of the conformal contact 129. Preferably, the interconnect 111 is disposed below a top surface 128 of the first electrical device 131 as shown by arrow 128a. Moreover, it is desirable for the top portion 129a to be thinner than a side portion 129b of the conformal contact 129. One advantage to having a thinner top portion 129a and to having the interconnect 111 disposed below the top surface 128 is that the first electrical device 131 can be positioned closer to a surface such as a sheet of paper if the first electrical device 131 is a thermal ink jet printhead, for example.

Figure 11:
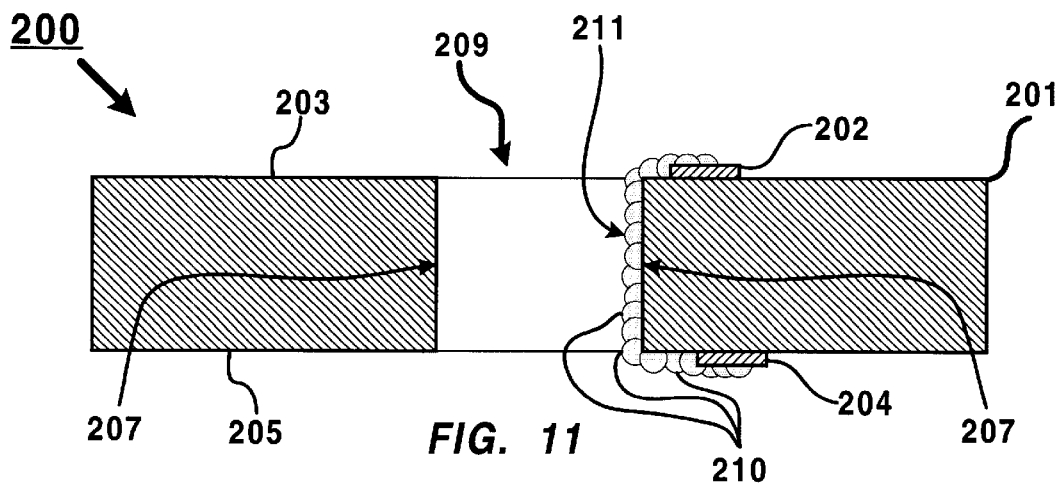
FIG. 11 is a cross-sectional view of a three-dimensional interconnect system that includes an electrical device having a via according to the present invention.

In another embodiment of the present invention, as illustrated in FIG. 11, a three-dimensional interconnect system 200 includes an electrical device 201. The electrical device 201 includes a first surface 203 and a second surface 205. Although FIG. 11 illustrates the first and second surfaces disposed opposite one another and substantially parallel to one another, the first and second surfaces need not be disposed opposite one another nor parallel to one another.

The electrical device 201 includes a first contact pad 202 disposed on the first surface 203 and a second contact pad 204 disposed on the second surface 205. A via 209 is formed by sidewall surfaces 207 that extend between the first and second surfaces 203 and 205. A plurality of contiguously interconnected electrically conductive droplets 210 define an interconnect 211. The interconnect 211 is disposed on a portion of the first and second surfaces 203 and 205 and on a discrete portion of the sidewall surfaces 207 of the via 209. The interconnect 211 and the droplets 210 are identical to the interconnect 111 and the droplets 110 described above in reference to FIG. 4.

The interconnect 211 is operative to electrically connect the first contact pad 202 with the second contact pad 204. For instance, the first contact pad 202 can be the terminal of a resistor and the second contact pad 204 can be the input pin of a light emitting diode (LED). The types of electronic devices used will determine the type of the contact pad for a given application. For example, the first contact pad 202 can be a pin on a video chip and the second contact pad 204 can be a pin on a video DRAM. The via 209 can be formed by various methods known to those skilled in the art. For example, laser ablation can be used to form the via 209. On the other hand, if the electrical device 201 is a semiconductor substrate, the via 209 can be formed by etching.

Figure 12:
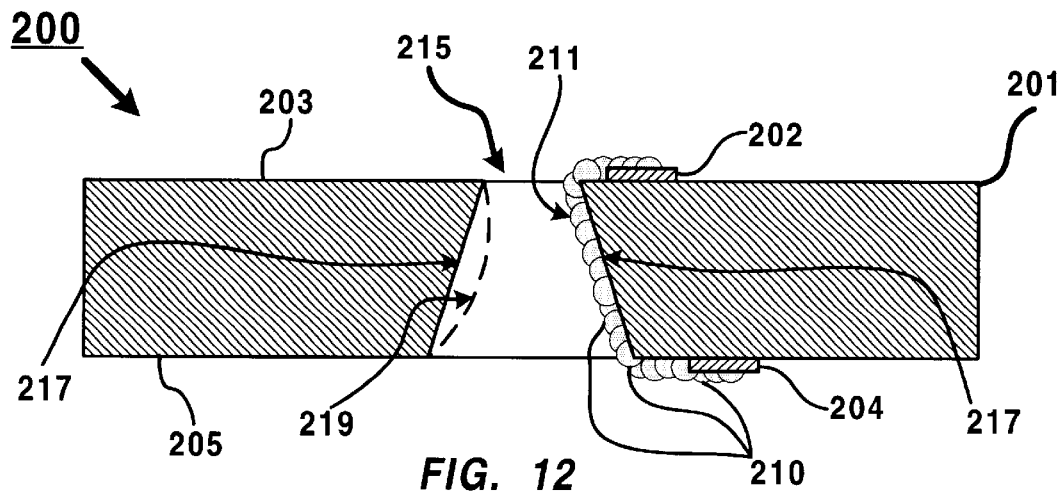
FIG. 12 is a cross-sectional view of a via having slope or arcuate sidewall surfaces according the present invention.

In one embodiment of the present invention, as illustrated in FIG. 12, the three-dimensional interconnect system 200 includes a via 215 with sidewall surfaces 217 having a sloped shape. The interconnect 211 is disposed on a discrete portion of the sidewall surfaces 217. Alternatively, the via 215 can have sidewall surfaces 219 having an arcuate shape (dashed line). The sidewall surfaces 219 can have a concave surface shape as shown in FIG. 12 or a convex surface shape (not shown).

In another embodiment of the present invention, the interconnect 211 can substantially cover the sidewall surfaces 207, 217, and 219 of FIGS. 11 and 12 respectively.

In the embodiments of FIGS. 11 and 12, it may be necessary to rotate the electrical device 201 so that the trajectory of the droplets 210 results in the droplets 210 impacting on the sidewall surfaces of the via. For instance, the electrical device 201 can be attached to a precision motion controlled table (not shown) that translates the electrical device 201 along X, Y, and Z axis and also rotates the electrical device 201 about those axis.

Figure 13:
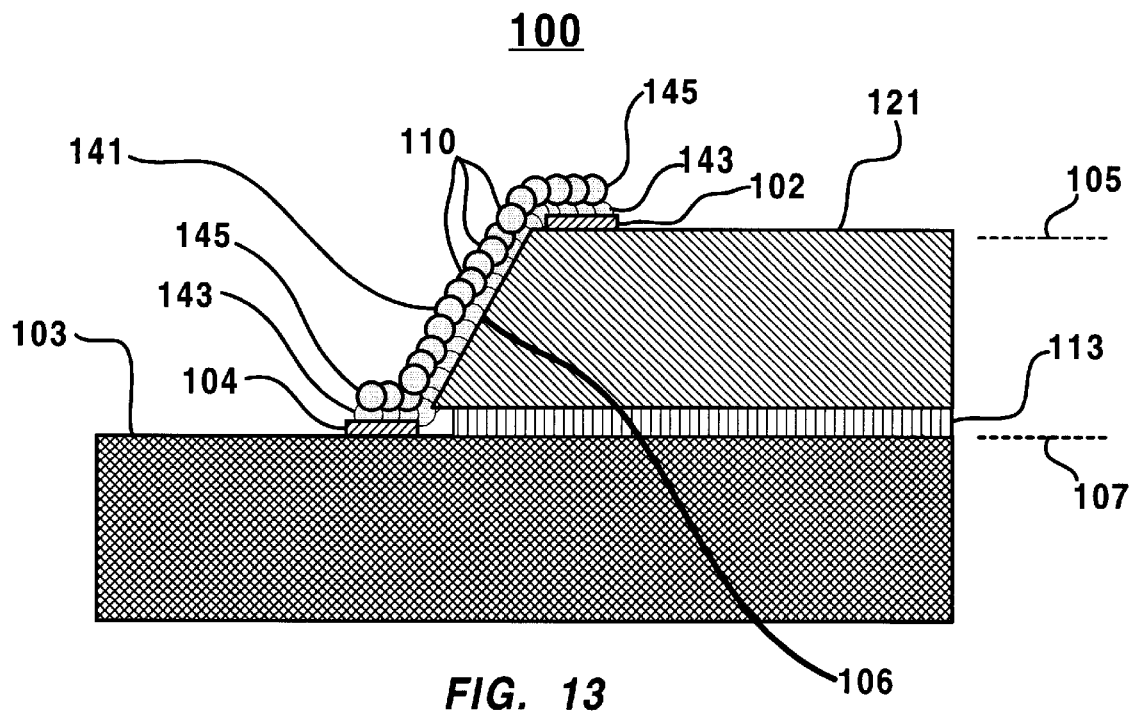
FIG. 13 is cross-sectional view of a three-dimensional interconnect system that includes an interconnect formed by contiguous stacks of conductive droplets according to the present invention.

In one embodiment of the present invention, as illustrated in FIG. 13, the three-dimensional interconnect system 100 includes an interconnect 141 that is formed from a plurality of contiguously interconnected electrically conductive droplets 110. The droplets 110 are disposed in a plurality of contiguous stacked segments 143 and 145. The stacked segment 143 is deposited first, followed by the stacked segment 145 (having droplets 110 shown in heavy outline). The stacked segments 143 and 145 are physically connected to one another. The interconnect 141 is disposed on a portion of the first and second electronic devices 121 and 103 respectively. Stacking of the droplets 110 can be used to increase the current carrying capability of the interconnect 141, to increase the mechanically strength of the interconnect 141, to reduce the electrical resistance of the interconnect 141, or to provide redundancy in the electrical continuity of the interconnect 141. The aforementioned advantages to stacking will also apply to other embodiments to be described below.

Figure 14:
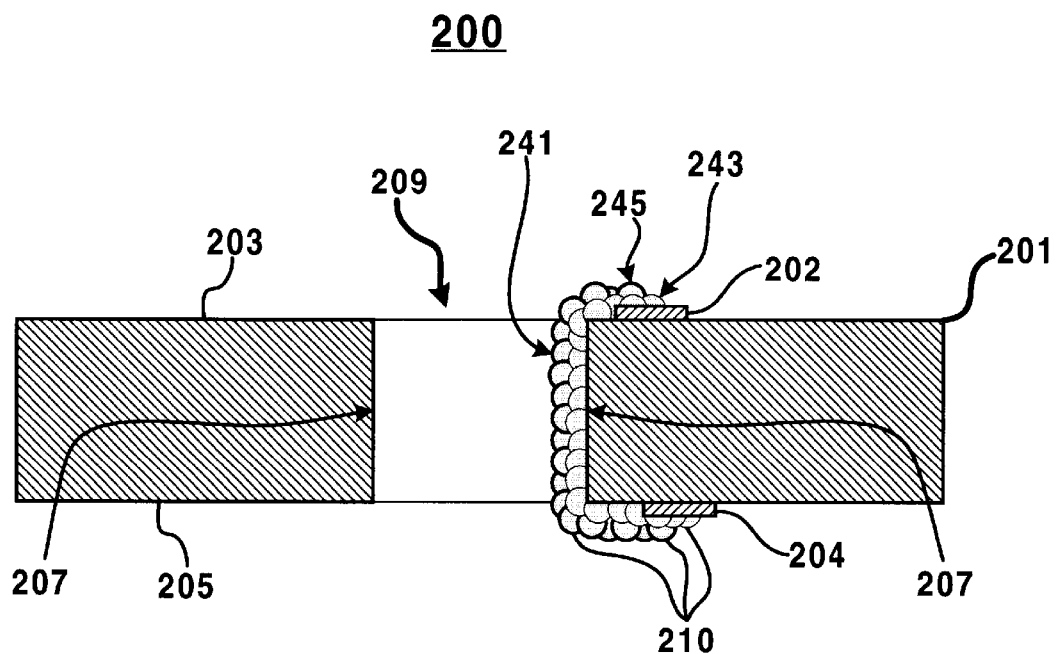
FIG. 14 is a cross-sectional view of a three-dimensional interconnect system that includes a via and an interconnect formed by contiguous stacks of conductive droplets according to the present invention.

Similarly, in FIG. 14, the three-dimensional interconnect system 200 includes an interconnect 241 that is formed from a plurality of contiguously interconnected electrically conductive droplets 210. The droplets 210 are disposed in a plurality of contiguous stacked segments 243 and 245. The stacked segment 243 is deposited first, followed by the stacked segment 245 (having droplets 210 shown in heavy outline). The stacked segments 243 and 245 are physically connected to one another. The interconnect 241 is disposed on a portion of the first and second surfaces 203 and 205 and a discrete portion of the sidewall surfaces 207 of the via 209 of the electronic device 201.

Figure 15:
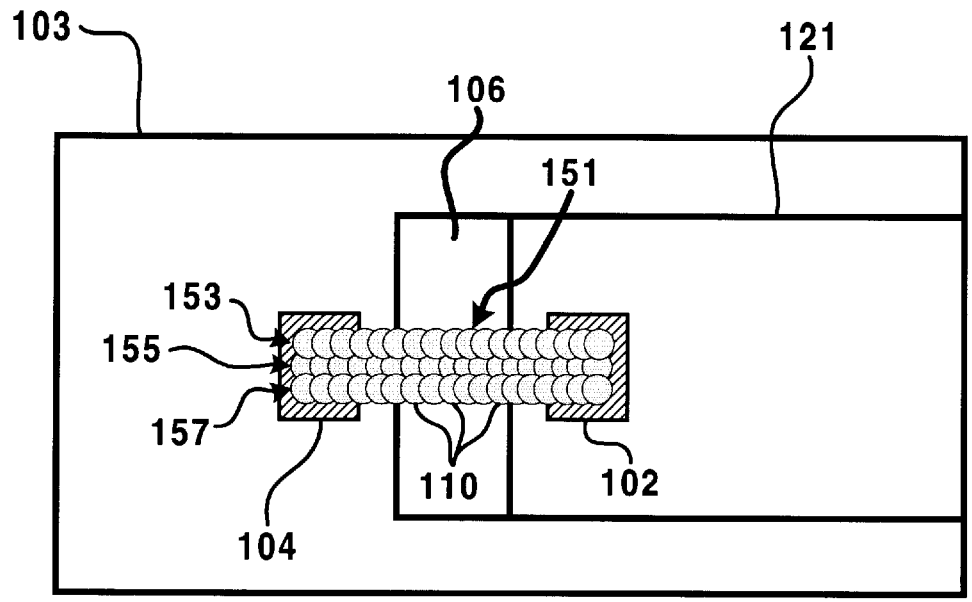
FIG. 15 is top plan view of a three-dimensional interconnect system that includes an interconnect formed by contiguous rows of conductive droplets according to the present invention.

In another embodiment of the present invention, as illustrated in FIG. 15, the three-dimensional interconnect system 100 includes an interconnect 151 that is formed from a plurality of contiguously interconnected electrically conductive droplets 110. The droplets 110 are disposed in a plurality of contiguous rows 153, 155, and 157. For example, row 153 can be deposited first, followed by row 155 and finally by row 157. The contiguous rows 153, 155, and 157 are physically connected to one another. The interconnect 151 is disposed on a portion of the first and second electronic devices 121 and 103 respectively. Disposing the droplets 110 in contiguous rows has the same advantages as stacking of the droplets as discussed above in reference to FIG. 13. However, when using rows, it is not necessary that the rows be contiguous. For instance, if the contact pads 102 and 104 of FIG. 15 are wide enough, then the rows can be disposed parallel to one another but not physically in contact with one another.

Figure 16:
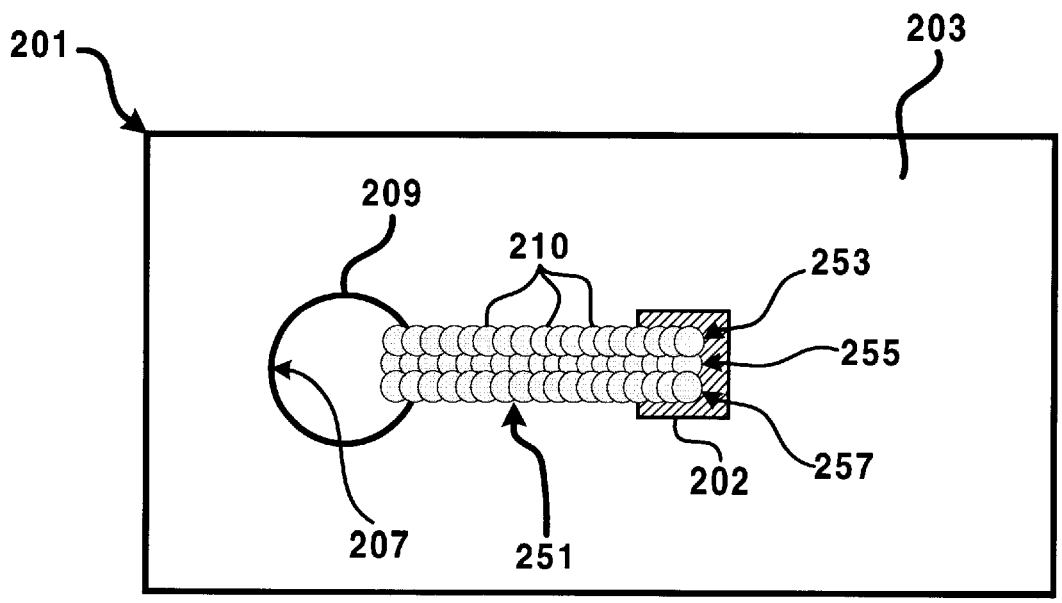
FIG. 16 is a top plan view of a three-dimensional interconnect system that includes a via and an interconnect formed by contiguous rows of conductive droplets according to the present invention.

Similarly, in FIG. 16, the three-dimensional interconnect system 200 includes an interconnect 251 that is formed from a plurality of contiguously interconnected electrically conductive droplets 210. The droplets 210 are disposed in a plurality of contiguous rows 253, 255, and 257. For example, row 253 can be deposited first, followed by row 255 and finally by row 257. The contiguous rows 253, 255, and 257 are connected to one another. The interconnect 251 is disposed on a portion of the first and second surfaces 203 and 205 (not shown) and a discrete portion of the sidewall surfaces 207 of the via 209 of the electronic device 201.

In a method for making a three-dimensional interconnect according to the present invention, an interconnect is formed by repeatedly ejecting electrically conductive droplets along an interconnect path on a workpiece that includes first and second electrical devices. The interconnect path defines a course the interconnect will pass over between the first and second electrical devices. Each ejected droplet impacts the workpiece on the interconnect path and adheres to the workpiece. As the droplets are repeatedly ejected, each ejected droplet is disposed adjacent to and in contact with another ejected droplet. Resulting are droplets that are contiguously interconnected along the interconnect path thereby forming the interconnect. The interconnect is operative to electrically connect the first and second electrical devices.

Figure 17:
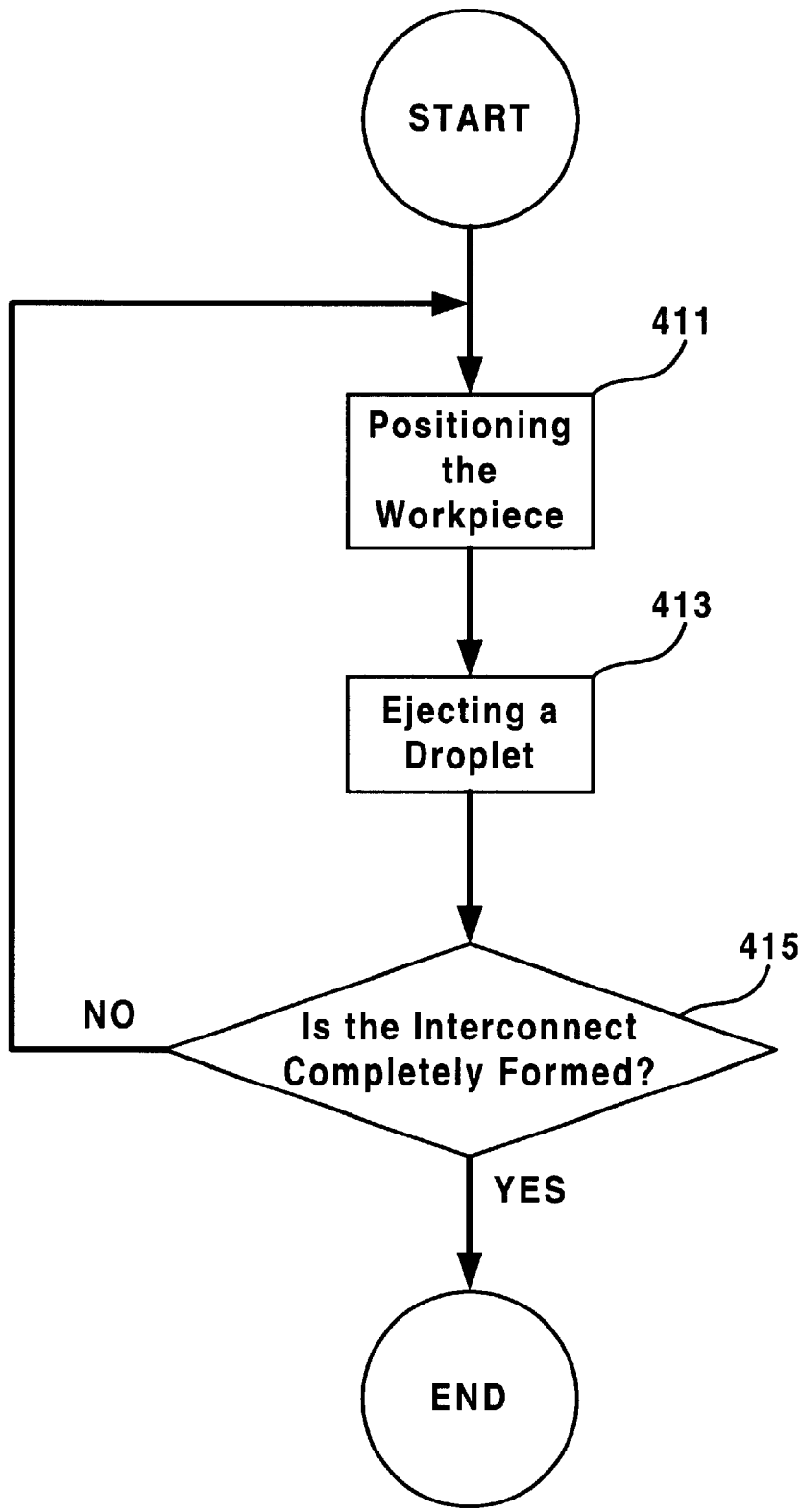
FIG. 17 is a chart illustrating a method for making a three-dimensional interconnect system according to the present invention.

In FIG. 17, a flowchart illustrates the method for making a three-dimensional interconnect according to the present invention. The method includes positioning the workpiece 411 relative to an ejection trajectory so that a portion of the interconnect path is aligned with the ejection trajectory. Once the workpiece is positioned, forming the interconnect begins by ejecting a droplet 413. The droplet travels along the ejection trajectory and impacts the workpiece on the interconnect path and adheres to the workpiece. Next, a determination is made as to whether or not the interconnect is completely formed 415 (i.e. the entire interconnect path has been traversed and the interconnect electrically connects the first and second electrical devices). If the interconnect is not completely formed, then the NO branch of the flowchart is taken and the positioning 411 and the ejecting 413 steps are repeated until the interconnect path has been completely formed. If the interconnect is completely formed, then the YES branch of the flowchart is taken and the process of forming the interconnect has ended. For instance, the three-dimensional interconnect system 100 as illustrated in FIGS. 4, 5, 8, and 10 can be made using the above described method.

In one embodiment of the method, the workpiece includes first and second electrical devices that are non-coplanar and the interconnect path follows a non-coplanar path.

In another embodiment of the method, the workpiece includes first and second electrical devices that are non-coplanar. Prior to the ejecting step 413, the electrical devices are physically attached to one another. By attaching the first and second electrical devices, relative movement between the first and second electrical devices is prevented. The first and second electrical devices can be physically attached as described above in reference to FIG. 5.

In one embodiment of the method, the first electrical device includes a first contact pad and the second electrical device includes a second contact pad. The interconnect formed by the ejecting step 413 is operative to electrically connect the first contact pad with the second contact pad.

In another embodiment of the method, prior to the ejecting step 413, the method includes the step of depositing an interface coating intermediate between adjacent surfaces of the first and second electrical devices. After the depositing step, the ejecting step 413 disposes at least a portion of the interconnect on the interface coating as was discussed above in reference to FIG. 9.

In one embodiment of the method, after the interconnect is completely formed 415, the method can include the step of encapsulating the interconnect with a conformal coating. The conformal coating is disposed on the interconnect and encases the interconnect as described above in reference to FIGS. 6 and 7. After the interconnect has been encapsulated by the conformal coating, the method can include the step of heating the interconnect to reflow the droplets.

In yet another method for making a three-dimensional interconnect according to the present invention, an interconnect is formed by repeatedly ejecting electrically conductive droplets along an interconnect path on an electrical device that includes first and second surfaces and a via formed by sidewall surfaces extending between the first and second surfaces. The interconnect path defines a course the interconnect will pass over on the first and second surfaces and on the sidewall surfaces of the via. Each ejected droplet impacts the electronic device on the interconnect path and adheres to the electronic device. As the droplets are repeatedly ejected, each ejected droplet is disposed adjacent to and in contact with a another ejected droplet. Resulting are droplets that are contiguously interconnected along the interconnect path thereby forming the interconnect. The interconnect is operative to electrically connect a first contact pad disposed on the first surface with a second contact pad disposed on the second surface. A portion of the interconnect is disposed on the first and second surfaces and on a discrete portion of the sidewall surfaces of the via.

Figure 18:
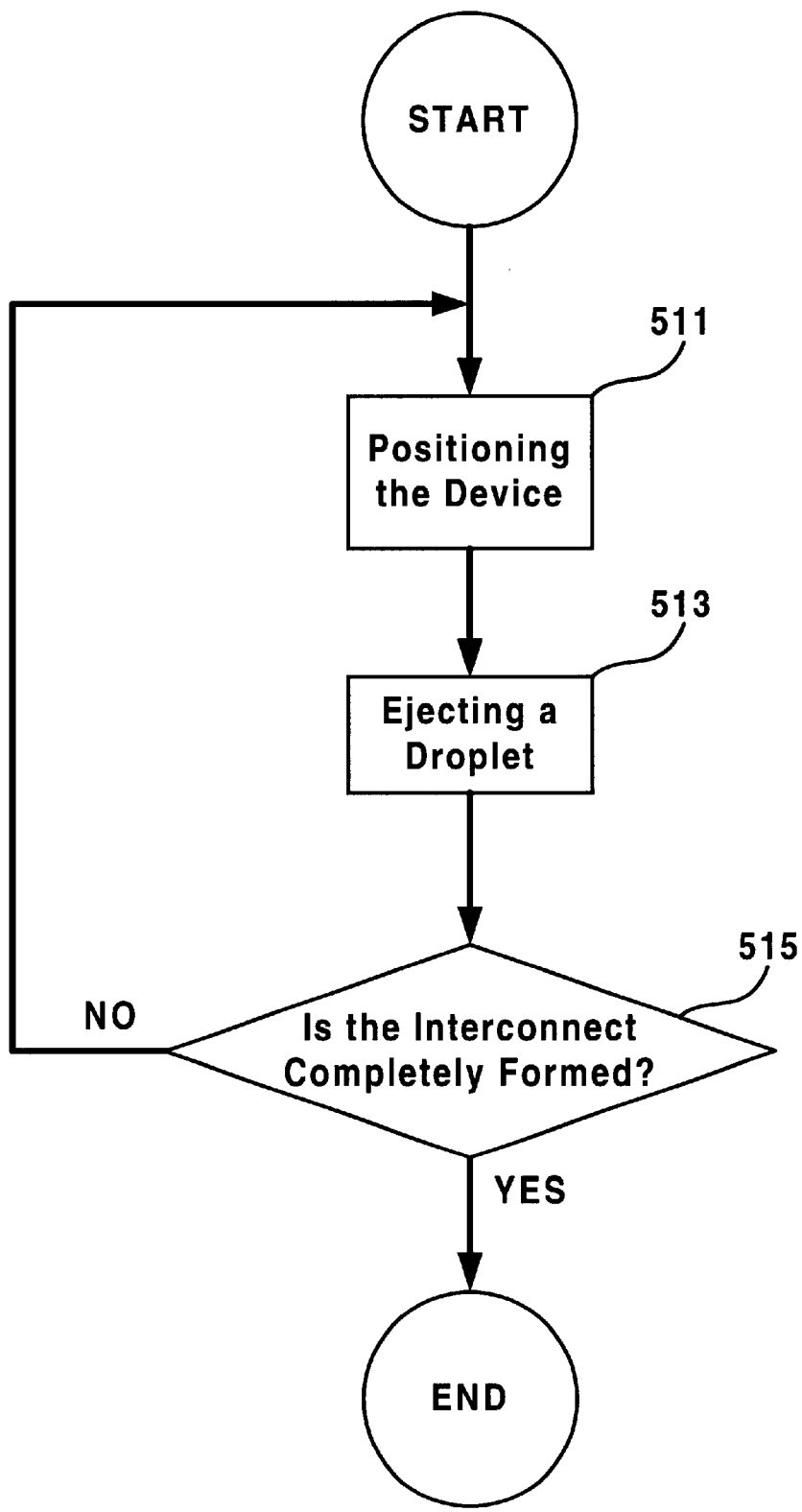
FIG. 18 is a flow chart illustrating yet another method for making a three-dimensional interconnect system according to the present invention.

In FIG. 18, a flowchart illustrates the method for making a three-dimensional interconnect according to the present invention. The method includes positioning an electronic device 511 relative to an ejection trajectory so that a portion of the interconnect path is aligned with the ejection trajectory. Once the electronic device is positioned, forming the interconnect begins by ejecting a droplet 513. The droplet travels along the ejection trajectory and impacts the electronic device on the interconnect path and adheres to the electronic device. Next, a determination is made as to whether or not the interconnect is completely formed 515 (i.e. the entire interconnect path has been traversed and the interconnect electrically connects the first and second contact pads). If the interconnect is not completely formed, then the NO branch of the flowchart is taken and the positioning 511 and the ejecting 513 steps are repeated until the interconnect path has been completely formed. If the interconnect is completely formed, then the YES branch of the flowchart is taken and the process of forming the interconnect has ended. The positioning step 511 can include rotation and/or translation of the electronic device so that the sidewall surfaces of the via are aligned with the droplet trajectory and droplets ejected during the ejecting step 513 impact the sidewall surfaces and adhere thereto.

In a system for making a three-dimensional interconnect on a workpiece that includes first and second electrical devices according to the present invention, the system includes an ejector for ejecting electrically conductive droplets. The ejected droplets are deposited on the workpiece and adhere to the workpiece. A positioning device imparts relative motion between the workpiece and the ejector so that the relative motion results in successive droplets being deposited on the workpiece along a predetermined interconnect path. The deposited droplets are contiguously interconnected to form an interconnect that substantially traces the interconnect path and electrically connects the first and second devices. The term "traces" as used herein means that the interconnect follows the course of the predetermined interconnect path. For example, if the predetermined interconnect path is Z-shaped, then the interconnect would trace that path and the resulting interconnect would also be Z-shaped.

Figure 19:
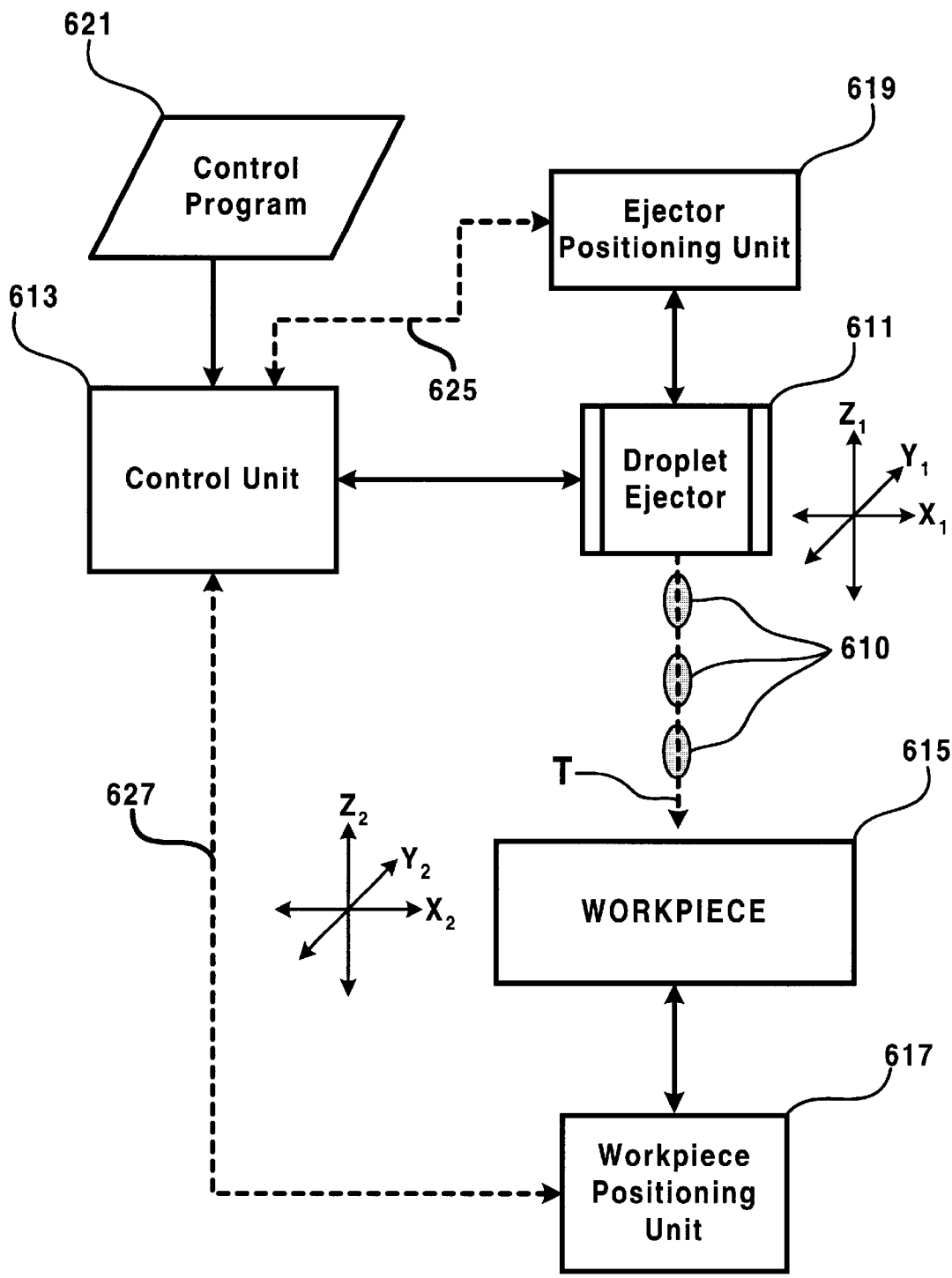
FIG. 19 is a block diagram of a system for making a three-dimensional interconnect system according to the present invention.

As illustrated in FIG. 19, a system 600 for making a three-dimensional interconnect according to the present invention includes a droplet ejector 611. The ejector 611 is operative to eject electrically conductive droplets 610. After a droplet is ejected from the ejector 611, the droplet travels along a trajectory T (dashed arrow) and impacts on a workpiece 615. The workpiece 615 includes first and second electrical devices (not shown). Ejection of the droplets 610 is controlled by a control unit 613 that is in communication with the ejector 611. Signals from the control unit 613 control droplet ejection and the path the droplets will form on the workpiece 615. The workpiece 615 is positioned so that the trajectory T of the droplets 610 will result in the droplets 610 impacting on the workpiece 615 at a predetermined point (i.e. the trajectory T is in alignment with a portion of the interconnect path). The control unit 613 can be driven by a control program 621 that includes instructions and data that are executed by the control unit 613. For example, the control program 621 can be the output from a computer aided design (CAD) program and the control unit 613 can be a PC, a computer workstation, or a custom built controller that executes the instructions and data from the control program 621. The CAD program can be used to design the layout of one or more interconnects (not shown) to be formed on the workpiece 615. For each interconnect to be formed there will be a corresponding interconnect pattern generated by the CAD program. Each interconnect pattern corresponds with a predetermined interconnect path on the workpiece 615.

Each pattern is written (transferred) onto the workpiece 615 by incrementally moving the ejector 611 and/or the workpiece 615 as the droplets 610 are ejected. Since the interconnect can be formed by relative motion between the ejector 611 and the workpiece 615, it follows that the ejector 611 can be stationary and the workpiece 615 can be moved by a workpiece positioning unit 617 that is in mechanical communication with the workpiece 615 and is controlled by the control unit 613 as shown by dashed line 627. The workpiece positioning unit 617 is operative to impart motion to the workpiece 615. For instance, the workpiece positioning unit 617 can be a precision motion controlled table that moves the workpiece 615 in three-dimensions as shown by the $X_2$, $Y_2$, and $Z_2$ axis.

On the other hand, the workpiece 615 can be stationary and the ejector 611 can be moved by an ejector positioning unit 619 that is in mechanical communication with the ejector 611 and is controlled by the control unit 613 as shown by dashed line 625. The ejector positioning unit 619 is operative to impart motion to the ejector 611. For instance, the ejector positioning unit 619 can be a precision motion controlled table that moves the ejector 611 in three-dimensions as shown by the $X_1$, $Y_1$, and $Z_1$ axis.

It will be obvious to one skilled in the art, that simultaneous movement of both the ejector 611 and the workpiece 615 can be used to effectuate the writing of the interconnect on the workpiece 615. Although Cartesian coordinates are illustrated, other coordinate systems can be used. Furthermore, movement of the ejector 611 and/or the workpiece 615 can include rotation, translation, or a combination thereof.

In applications requiring accuracy in the writing of the droplets 610 on the workpiece 615 an alignment target (not shown) can be disposed on the workpiece 615. The target can be aligned with the trajectory T and then one or more test droplets can be ejected by the ejector 611. The impact positions of the droplets on the target can be used by the control unit 613 to correct for factors that can impact the trajectory T of the droplets 610. Those factors can include: aiming accuracy of the ejector 611; droplet drift; droplet temperature; droplet viscosity; and environmental conditions such as temperature, and humidity.

The increments of relative motion (step size) between the ejector 611 and the workpiece 615 will be application dependent. For example, if the contact pads (not shown) on the electrical devices to be connected have a size that is in the $\mu$m range (e.g. about 50 $\mu$m to about 100 $\mu$m), as is the case with state-of-the-art IC's, and the pitch between adjacent contact pads is in the $\mu$m range (e.g. about 100 $\mu$m to about 250 $\mu$m), then the step size will also be in the $\mu$m range. Moreover, the size of the droplets 610 is also a factor in determining the step size. If the step size exceeds the diameter of a deposited droplet, then adjacent droplets 610 may not be in contact with one another. Resulting is a discontinuity in the interconnect that could cause an open circuit, for example.

Figure 20:
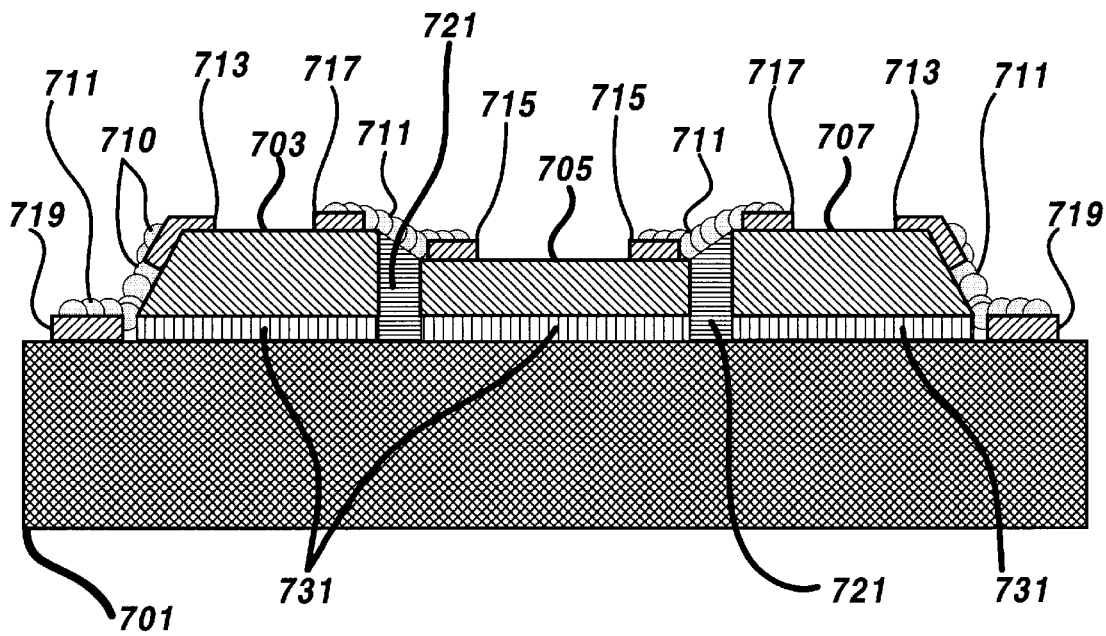
FIG. 20 is a cross-sectional view of a product made by the system of FIG. 19 according to the present invention.

FIG. 20, as well as FIGS. 4 through 16, illustrate a product made by the system 600 for making a three-dimensional interconnect according to the present invention. In FIG. 20, the product 700 includes electrical devices 701, 703, 705, and 707. The devices 703, 705, and 707 are disposed on a different physical plane than the device 701 and are physically attached 731 to the device 701. For instance, glue or an adhesive can be used to attach 731 the devices 703, 705, and 707 to the device 701. Contact pads 719 on the device 701 are electrically connected to conformal contact pads 713 (as described above in reference to FIG. 10) on devices 703 and 707 respectively, by an interconnect 711. The interconnect 711 includes a plurality of contiguously interconnected electrically conductive droplets 710. Similarly, contact pads 717 on devices 703 and 707 are electrically connected to contacts 715 on device 705 by the interconnect 711. An interface coating 721 (as described above in reference to FIG. 9) is disposed between adjacent surfaces of devices 703, 705, and 707. The product 700 can include a variety of electronic devices. For example, the device 701 can be a microprocessor die and the devices 703 and 707 can be a DRAM die mounted directly on the microprocessor. The device 705 can be a DRAM controller die that is also mounted on the microprocessor.

Figure 21:
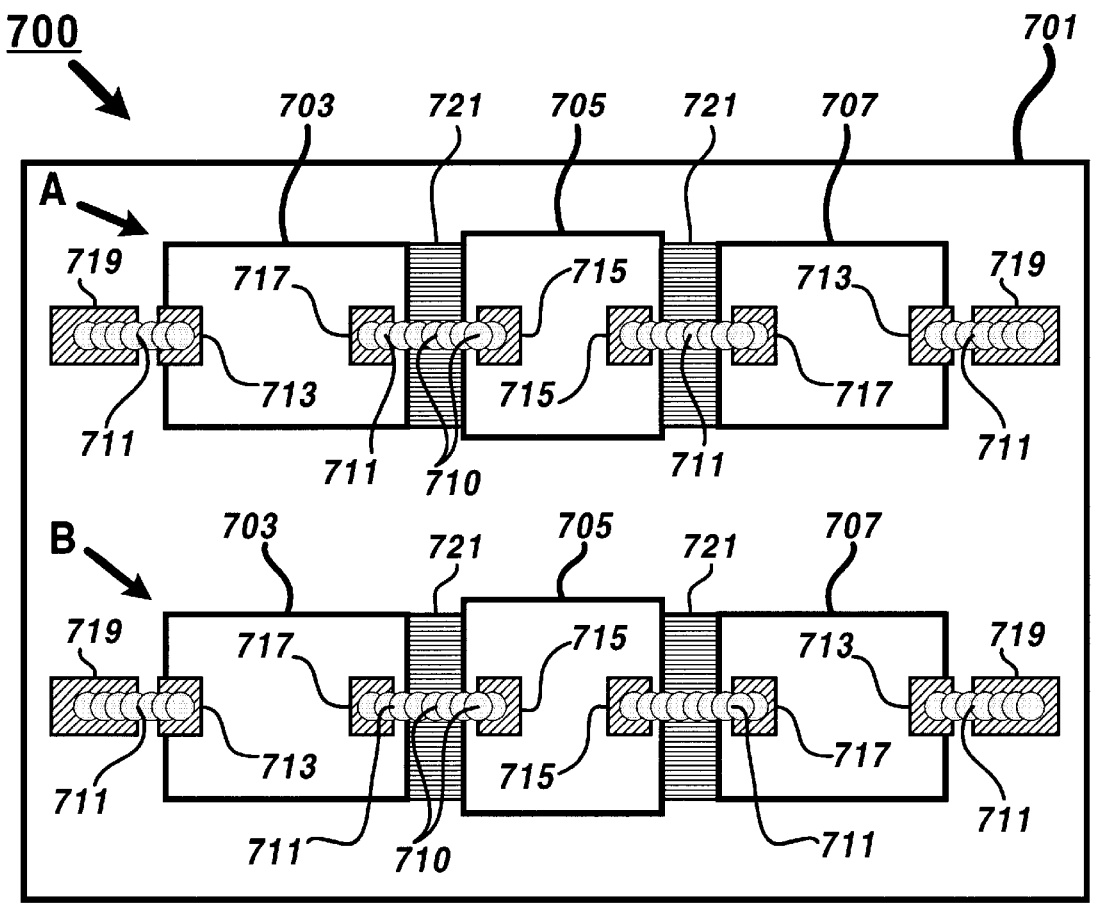
FIG. 21 is a top plan view of a product made by the system of FIG. 19 according to the present invention.

FIG. 21 is a top plan view of the product 700 illustrated in FIG. 20. As can be seen from FIG. 21 the device 701 includes a plurality of device banks A and B that are disposed on the device 701. For instance, the device 701 can have two banks of DRAM configured as banks A and B. FIG. 21 illustrates an example of how a plurality of devices disposed on different physical planes can be electrically connected using the interconnect 711; however, it will be obvious to one skilled in the art that other connections such as VDD and GND (not shown) would be required for proper circuit operation. For example, an interconnect (not shown) between banks A and B may be required. Therefore, the three-dimensional interconnect of the present invent is not to be construed as being limited only to the connections illustrated herein.

Although several embodiments of the present invention have been disclosed and illustrated, the invention is not limited to the specific forms or arrangements of parts so described and illustrated. The invention is only limited by the claims.

What is claimed is:

1. A three-dimensional interconnect system, comprising:
   a first electrical device including a first contact pad, the first electrical device is disposed on a first physical plane;
   a second electrical device including a second contact pad, the second electrical device is disposed on a second physical plane, and the first and second electrical devices are positioned in fixed relation to each other to prevent relative movement therebetween;
   a plurality of contiguously interconnected electrically conductive droplets defining an interconnect, the interconnect including a plurality of segments selected from the group consisting of substantially horizontal segments, substantially vertical segments, and a combination of horizontal and vertical segments,
   the interconnect is disposed on a portion of the first and second contact pads and is in electrical contact with the first and second contact pads such that the interconnect is operative only to electrically connect the first electrical device with the second electrical device, and;
   wherein at least a portion of the interconnect is disposed on an edge selected from the group consisting of a horizontal edge, a vertical edge, and a combination horizontal and vertical edge of the first and second electrical devices.

2. The three-dimensional interconnect system of claim 1, wherein the first electrical device and the second electrical device are physically connected with each other to prevent relative movement between the first and second electrical devices.

3. The three-dimensional interconnect system of claim 1, wherein the electrically conductive droplets are made from a material selected from the group consisting of a metal, a conductive polymer, and solder ball droplets.

4. The three-dimensional interconnect system of claim 1, and further comprising a conformal coating disposed on and encapsulating the interconnect.

5. The three-dimensional interconnect system of claim 4, wherein the conformal coating is a material selected from the group consisting of an adhesive, an inorganic coating, and a polymer.

6. The three-dimensional interconnect system of claim 4, wherein the interconnect is reflowed within the conformal coating that encapsulates the interconnect, whereby the conformal coating protects the interconnect from physical damage and substantially retains the shape of the interconnect after reflow, and whereby an electrical resistance of the interconnect is reduced after reflow.

7. The three-dimensional interconnect system of claim 1, wherein at least one of the electrical devices includes a beveled edge and at least a portion of the interconnect is disposed on the beveled edge.

8. The three-dimensional interconnect system of claim 1 and further comprising an interface coating disposed intermediate between adjacent surfaces of the first and second electrical devices and at least a portion of the interconnect is disposed on the interface coating.

9. The three-dimensional interconnect system of claim 8, wherein the interface coating is a material selected from the group consisting of a polymer and an inorganic material.

10. The three-dimensional interconnect system of claim 8, wherein the interface coating has a surface shape selected from the group consisting of a sloped surface and an arcuate surface.

11. A product made by a system for making a three-dimensional interconnect on a workpiece, the workpiece including first and second electrical devices that are disposed on different physical planes and are physically connected with each other, the first electrical device including a first contact pad and the second electrical device including a second contact pad, the system comprising:

an ejector for ejecting electrically conductive droplets, such that the ejected droplets are deposited on the workpiece and adhere to the workpiece; and a positioning means for imparting relative motion between the ejector and the workpiece, such that the relative motion is operative to cause successively ejected droplets to be deposited on the workpiece along a predetermined interconnect path, and such that the deposited droplets are contiguously interconnected to form the three-dimensional interconnect and the three-dimensional interconnect substantially traces the interconnect path, the three-dimensional interconnect is in contact with the first and second contact pads and the three-dimensional interconnect is operative only to electrically connect the first and second electrical devices with each other, the three-dimensional interconnect includes a plurality of segments selected from the group consisting of substantially horizontal segments, substantially vertical segments, and a combination of horizontal and vertical segments, and wherein a portion of the three-dimensional interconnect is disposed on an edge of a selected one or both of the first and second devices and the edge is selected from the group consisting of a horizontal edge, a vertical edge, and a combination horizontal and vertical edge.

* * * * *